United States Patent [19]

Runaldue et al.

[11] Patent Number: 5,576,560

[45] Date of Patent: Nov. 19, 1996

[54] DUAL PORT MEMORY, SUCH AS USED IN COLOR LOOKUP TABLES FOR VIDEO SYSTEMS

[75] Inventors: Thomas J. Runaldue, San Jose; William Plants, Santa Clara, both of Calif.

[73] Assignee: Advanced Micro Devices, Inc., Sunnyvale, Calif.

[21] Appl. No.: 267,036

[22] Filed: Jun. 27, 1994

Related U.S. Application Data

[62] Division of Ser. No. 754,910, Sep. 4, 1991, Pat. No. 5,235,338.

[51] Int. Cl.⁶ .................................................. H01L 27/10
[52] U.S. Cl. ........................ 257/208; 257/206; 257/903
[58] Field of Search .................................. 257/202, 203, 257/207, 208, 903, 909

[56] References Cited

U.S. PATENT DOCUMENTS

| | | | |
|---|---|---|---|
| 3,728,556 | 4/1973 | Arnell | 307/251 |
| 3,967,252 | 6/1976 | Donnelly | 340/173 |
| 4,120,048 | 10/1978 | Fuhrman | 365/239 |
| 4,140,930 | 2/1979 | Tanaka | 307/362 |
| 4,216,390 | 8/1980 | Stewart | 307/264 |
| 4,220,997 | 9/1980 | Hager | 364/900 |
| 4,247,791 | 1/1981 | Rovell | 307/355 |
| 4,310,878 | 1/1982 | Hyatt | 364/183 |
| 4,394,726 | 7/1983 | Kohl | 364/200 |
| 4,396,976 | 8/1983 | Hyatt | 364/167 |

(List continued on next page.)

FOREIGN PATENT DOCUMENTS

| | | |
|---|---|---|
| A20097778 | 1/1984 | European Pat. Off. . |
| A20135940 | 4/1985 | European Pat. Off. . |
| 54-144834 | 11/1979 | Japan . |
| 56-44193 | 4/1981 | Japan . |
| 56-71887 | 6/1981 | Japan . |
| 58-35793 | 3/1983 | Japan . |
| 58-146089 | 8/1983 | Japan . |
| 59-60793 | 4/1984 | Japan . |
| 63-197088 | 8/1988 | Japan . |

OTHER PUBLICATIONS

Brooktree Corp., "Bt451, Bt 457, Bt458 125MHz/170MHz Monolithic CMOS 256 Color Palette RAMDAC", 1989.
Baitinger, et al., "Monolithic Storage Cell with FETs," 1972, vol. 14, No. 12, IBM Technical Disclosure Bulletin.

(List continued on next page.)

Primary Examiner—Jerome Jackson
Assistant Examiner—Nathan K. Kelley
Attorney, Agent, or Firm—Fliesler, Dubb, Meyer & Lovejoy

[57] ABSTRACT

An integrated circuit memory for a color lookup table for a display system. The memory has a video port and path for reading data identifying colors for pixels at >100 or even >200 MegaHertz, and a CPU port and path for reading and writing data identifying colors at locations in the memory.

Each memory cell includes a flip-flop with true and complement terminals. The CPU port includes two pass transistors, each having a first channel terminal coupled to the true or complement terminal, a second channel terminal coupled to a bidirectional bit line of the CPU path, and a gate coupled to a word line of the CPU path. The video port includes an isolated sensing terminal and two transistors. A first transistor has a first channel terminal coupled to the isolated sensing terminal, a second channel terminal coupled to a reference, and a gate coupled to the true or complement terminal. A second transistor has a first channel terminal coupled to the isolated sensing terminal, a second channel terminal coupled to a bit line of the video path, and a gate coupled to a word line of the video path.

A layout configuration of each memory cell and of the memory cell array allows same-channel-type transistors from a plurality of memory cells to be formed in a single, large well, and allows adjacent memory cells to share contacts. This reduces the integrated circuit's size, improves its speed, and increases manufacturing yields.

8 Claims, 9 Drawing Sheets

U.S. PATENT DOCUMENTS

| | | | |
|---|---|---|---|
| 4,420,819 | 12/1983 | Price et al. | 364/900 |
| 4,443,855 | 4/1984 | Bishop et al. | 364/513 |
| 4,456,965 | 6/1984 | Graber et al. | 364/900 |
| 4,471,456 | 9/1984 | Branigan et al. | 364/90 |
| 4,485,450 | 11/1984 | Characklis et al. | 364/550 |
| 4,490,633 | 12/1984 | Noufer et al. | 307/475 |
| 4,507,759 | 3/1985 | Yasui et al. | 365/189 |
| 4,541,076 | 9/1985 | Bowers et al. | 365/190 |
| 4,578,780 | 3/1986 | Baba | 365/190 |
| 4,627,018 | 2/1986 | Trost et al. | 364/900 |
| 4,684,942 | 8/1987 | Nishi et al. | 340/703 |
| 4,715,017 | 12/1987 | Iwahashi et al. | 365/239 |
| 4,719,596 | 1/1988 | Bernstein et al. | 365/189 |
| 4,768,172 | 8/1988 | Sasaki | 365/230 |
| 4,780,852 | 10/1988 | Kajigaya et al. | 365/203 |
| 4,791,607 | 12/1988 | Igarashi et al. | 365/51 |
| 4,815,033 | 3/1989 | Harris | 364/900 |
| 4,905,189 | 2/1990 | Brunolli | 364/900 |
| 4,965,651 | 10/1990 | Wagner | 257/206 |
| 5,150,326 | 9/1992 | Aoki | 365/156 X |

OTHER PUBLICATIONS

Boysel, et al., "Multiphase Clocking Achieves 100–Nsec MOS Memory," 1968, Edn.

Glasser, et al., "Random Access Memory," 1985, The Design and Anaylsis of VLSI Circuits, Chap. 7 pp. 388–393, 422–423.

Gray, et al., "Analog MOS Integrated Circuits," 1978, IEEE J. Solid–State Circuits, vol. SC–13, pp. 1–49.

Gray, et al., "Analysis and Design of Analog Integrated Circuits," 2d Ed., 1984, pp. ix–xiii, 703–764.

Hardee, et al., "THPM 15.2: A 30ns 64K CMOS RAM," 1984, IEEE Int'l. Solid–State Circuits Conference, pp. 216–217, 341.

Ishimoto, et al., "WAM 3.1: A 256K Dual Port Memory," 1985, IEEE Intl. Solid–State Circuits Conference, pp. 38–39, 300.

Pinkham, et al., "A High Speed Dual Port Memory with Simultaneous Serial & Random Mode Access for Video Apps.," IEEE J. of Solid–State Circuits, pp. 999–1007.

Pinkham, "Video Memory Technology and Applications," 1984, Wescon/'84 Conference Record, pp. 29/5 1–9.

Pope, "Asynchronous Dual–Port RAM Simplifies Multiprocessor Systems," 1983, Electrical Design News, vol. 28, No. 18, pp. 147–154.

Takahashi, et al., "A 240K Transistor CMOS Array with Flexible Allocation of Memory and Channels," 1985, IEEE J. of Solid–State Ciruits, vol. SC–20, No. 5, pp. 1012–1017.

Kodata, et al., "An 8Kb Content Addressable and Reentrant Memory," 1985, ISSCC Digest of Technical Papers, pp. 42–43.

Haraszti, "A Novel Associative Approach for Fault–Tolerant MOS RAM's," 1982, IEEE J. of Solid–State Circuits, vol. SC–17, No. 3, pp. 539–546.

Nikaido, et al., "A 1K Bit Associative Memory LSI," 1983, Japanese Journal of Applied Physics, vol. 22, pp. 51–54.

Reinert, et al., "An 32 ×9 ECL Dual Address Register Using an Interleaving Cell Technique," ISSCC Digest of Technical Papers, 1977, pp. 72–74.

Chesters, "A 1–Micron CMOS 128 MHz Video Serializer Palette, etc.", 1989, IEEE Comput. Sec. Press, Cat. No. 89CH2704–5, p. 1/117.

Conner, "Color–Palette Chips Bundle Extra Features with RAM Look–up Table and DACs," 1988, EDN vol. 33, No. 20, pp. 67–76.

Yeung, et al., "A 300MHz Bipolar–CMOS Video Shift Register with FIFO," 1987, ISSCC Digest of Technical Papers, Pp. 56–57.

DUAL PORT MEMORY, SUCH AS USED IN COLOR LOOKUP TABLES FOR VIDEO SYSTEMS

This application is a divisional application of Ser. No. 07/754,910 filed Sep. 4, 1991, U.S. Pat. No. 5,325,338.

CROSS-REFERENCE TO RELATED APPLICATIONS

Other applications of particular interest to and commonly assigned with the present application include: SC/Ser. No. 07/480,400 entitled CMOS CLAMP CIRCUITS filed Feb. 15, 1990 by Thomas J. Runaldue, and SC/Ser. No. 07/480,401 entitled CMOS PRECHARGE AND EQUALIZATION CIRCUIT filed Feb. 15, 1990 by Thomas J. Runaldue.

BACKGROUND OF THE INVENTION

1. Field of the Invention

The present invention relates to dual port memories, and particularly to special purpose dual port static random access memories (SRAMs) used as color lookup tables in display systems. More particularly, the invention relates to a high speed CMOS dual port SRAM having a read/write port and a very fast read-only port.

2. Description of the Background

It is often desirable to optimize the design of a memory cell to meet the needs of a particular application. For instance, static random access memories (SRAMs) have been implemented for a variety of applications. One particular application which has unique requirements is that of the color lookup table in display systems. Prior art integrated circuits which provide this function include the BT458, and similar parts manufactured by Brooktree Corporation, and the Am81C458 manufactured by Advanced Micro Devices, Inc. In these integrated circuits, a color lookup table is provided which stores codes that identify specific colors to be displayed on a video display screen.

For each picture element, or pixel, in the screen, the color lookup table is accessed with an address, and the code stored in the table at that address identifies the color of the pixel. This addressing occurs at a very high rate of speed which is determined by the frequency at which pixels must be refreshed in the display system. Also, when the selections of colors available in the color lookup table must be changed, updated, or monitored, a central processing unit in the display system must have access to the entries in the table. For this purpose, a second, slower port, which allows reading and writing to memory elements in the table, is provided for CPU access.

Because the CPU clock is unrelated to the speed at which the color information must be accessed for the display path, the display path and CPU path must operate independently and asynchronously of one another. The asynchronous and independent nature of the ports, together with the very high speed at which the display port must perform, create unique design criteria for an SRAM in this application.

The prior art devices referred to above each use a ten transistor SRAM cell with a differential sense amplifier, such as described in U.S. Pat. No. 4,905,189. This SRAM cell is relatively large and requires complex differential sensing schemes in order to achieve the necessary speed of operation for the video display port. The size and complexity of this prior art memory cell limited the speed at which it could operate. In addition, the size of the cell translated into a very large SRAM area on the integrated circuit. Large area increases the cost of manufacturing the chip for a variety of reasons well known in the art. U.S. Pat. No. 4,768,172 to Sasaki teaches an SRAM cell having a read-write port and a read-only port, in which the read-only port is isolated from the memory cell such that reading from the read-only port does not affect current flow within the memory cell. This isolation enhances the ability to simultaneously and asynchronously operate both ports. The patent does not, however, provide any specific adaptations of the memory cell for use in a color lookup table, or any other such application requiring very high-speed read access. Furthermore, the patent does not teach how to optimally utilize the available read-only bandwidth. Finally, the patent does not teach a way of optimally fitting a given size array of the memory cells within a given chip area.

Accordingly, it is desirable to provide a memory cell and an overall memory architecture which optimizes the requirements for independent and asynchronous ports, and very high-speed display access paths, while minimizing the size and complexity of the memory cell. The memory architecture should have an optimally reduced footprint, and should be provided with means for optimally utilizing the available speed of the read-only port, for very high-speed operations such as color lookup table reading in a color video display system.

SUMMARY OF THE INVENTION

Accordingly, the present invention provides a memory for a color lookup table on an integrated circuit used in a display system. The system includes a first access path for reading data identifying colors for picture elements, and a second access path for reading and writing data identifying colors at locations in the memory. The memory comprises a first set of bit lines and word lines connected to communicate data to the first access path. Also, a second set of bit lines and word lines is connected to communicate data to and from the second access path.

An array of memory cells is arranged to provide the color lookup table. Each memory cell in at least a subset of the array includes a single-ended port connected to one bit line and to one word line in the first set for communication through the first access path, and a second port connected to at least one bit line and to one word line in the second set for communication through the second access path.

The memory is characterized by operation of the first access path for random access reads at >100 MegaHertz for a first class of display systems. In addition, the memory is characterized by random access reads through the first access path at >125 MegaHertz for a second class of display systems. For yet a third class of display systems, the first access path performs random access reads at >150 MegaHertz. Further, for a high speed class of video displays, the first access path performs random access reads at >175 MegaHertz. The memory according to the present invention can provide operation for random access reads through the first access path at >200 MegaHertz using current technology.

According to another aspect of the invention, the memory cells in the array comprise a data storage element having true and complement terminals. The data storage element comprises a first inverter having an input coupled to the true terminal and an output coupled to the complement terminal, and a second inverter having an input coupled to the complement terminal and an output coupled to the true terminal. The single-ended port comprises first and second n-channel transistors where the first n-channel transistor has a first channel terminal providing an isolated sensing terminal, a second channel terminal connected to a reference potential, such as ground, and a gate connected to one of the true or complement terminals of the data storage element. The second n-channel transistor in the single-ended port has a first channel terminal connected to a bit line of the first set of bit lines for the first access path, a second channel terminal connected to the isolated sensing terminal provided by the first n-channel transistor, and a gate connected to a word line of the first set.

The second port comprises first and second p-channel transistors and is operated differentially. The first p-channel transistor has a first channel terminal connected to the true terminal of the data storage element, a second channel terminal connected to a bit line of the second set, and a gate terminal connected to a word line of the second set. The second p-channel transistor in the second port has a first channel terminal connected to the complement terminal of the data storage element, a second channel terminal connected to a bit line of the second set, and a gate connected to a word line of the second set. Therefore, reading and writing to the data storage element is provided through the pair of bit lines coupled to the first and second p-channel transistors, while fast random access reading is provided through the single-ended port.

According to another aspect of the invention, the first and second inverters in the data storage element include one p-channel and one n-channel transistor each, whereby the memory cell includes four n-channel and four p-channel transistors. In this aspect, the integrated circuit can be formed with four transistors of each memory cell being in a single well. Thus, for integrated circuits comprising an n-type substrate, a single p-type well can be formed in which all four n-channel transistors of the cell are placed. Similarly, for a p-type substrate, a single n-type well is formed in which all four p-channel transistors can be placed. This provides significant optimization for laying out the memory cell for small size and high speed.

According to yet another aspect of the invention, the memory cells are laid out such that they include a first contact coupling the single-ended port to a bit line on the first set, a second contact coupling the second port to a first bit line in the second set, and a third contact coupling the second port to a second bit line in the second set. These contacts are laid out on the perimeter of the respective memory cells such that they are shared with adjacent memory cells in the array. The sharing of contacts to the metal bit lines provides significant reduction in the footprint of the cell for compact layout, high speed operation, and improved yields in manufacturing. The sharing of certain of the contacts further provides the highly desirable advantage of reducing capacitances in signal paths, to improve signal transfer characteristics and reduce latency.

According to yet another aspect of the invention, the memory is laid out such that each cell has a footprint of less than 17 by 34 microns in a process which has a minimum channel length of 1 micron.

Accordingly, a memory is provided particularly adapted to the color lookup table application, but suitable for other dual port static random access memory applications. The memory has a very small layout for high yields in manufacturing, and is capable of very high speed reads through a first, single-ended port which is asynchronous and independent of a second, differential port used for reading and writing to the color lookup table.

Other aspects and advantages of the present invention can be seen upon review of the figures, the detailed description, and the claims which follow.

DETAILED DESCRIPTION OF EMBODIMENTS

Figure 1:
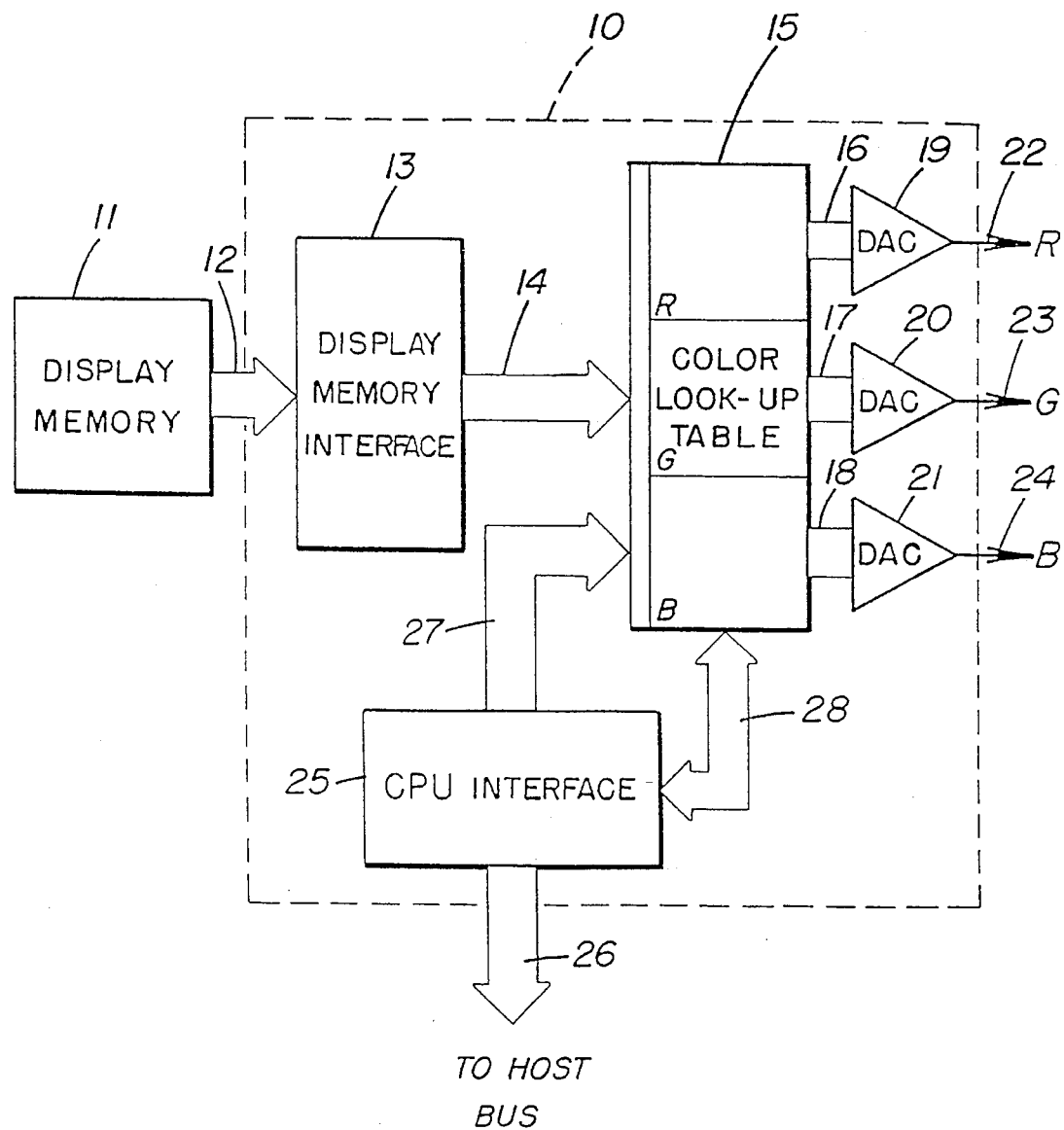
FIG. 1 is a schematic diagram of a video display system having an integrated circuit color lookup table according to the present invention.
Figure 2:
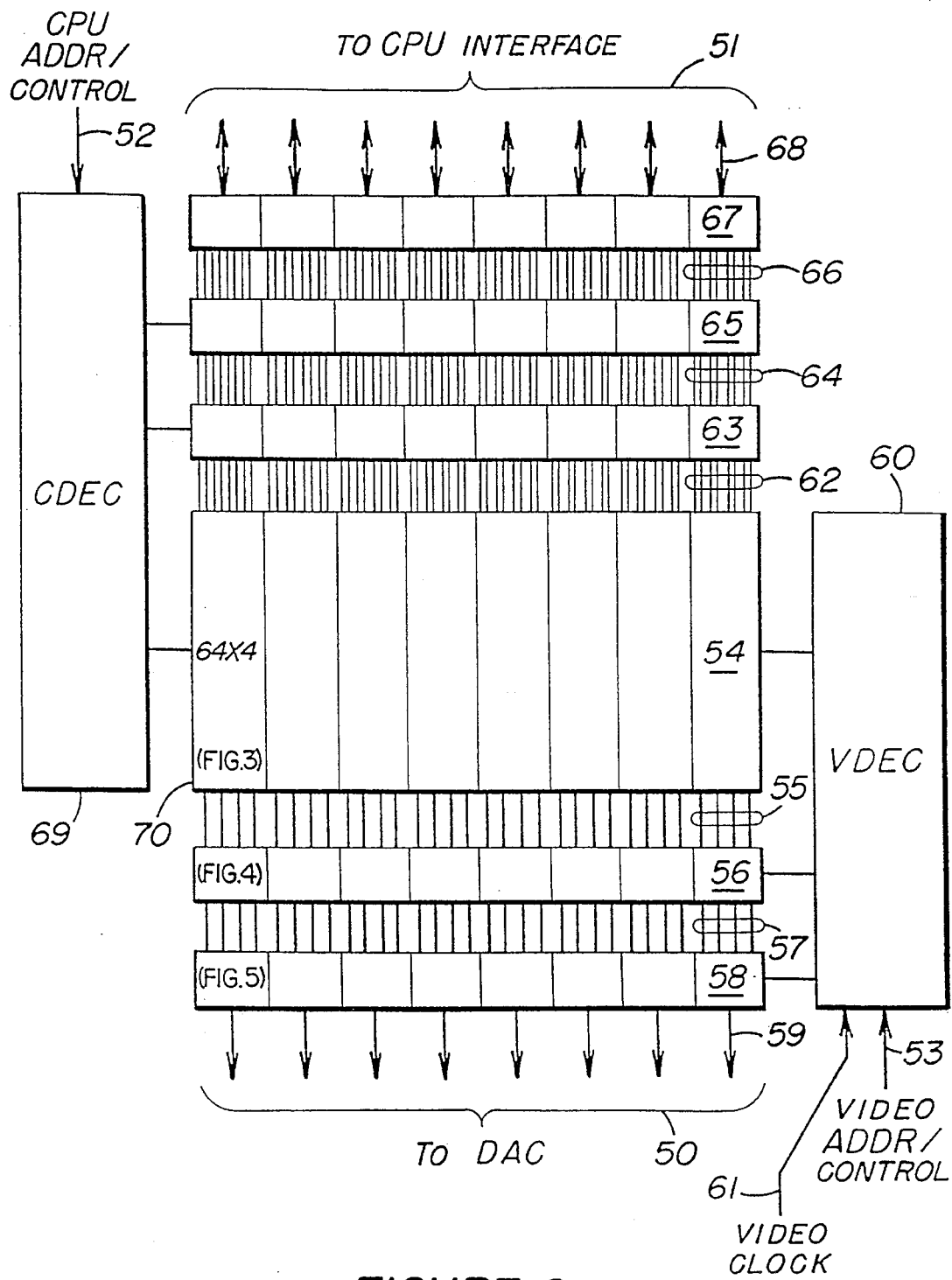
FIG. 2 is a Schematic diagram of a portion of the color lookup table SRAM of FIG. 1.
Figure 3:
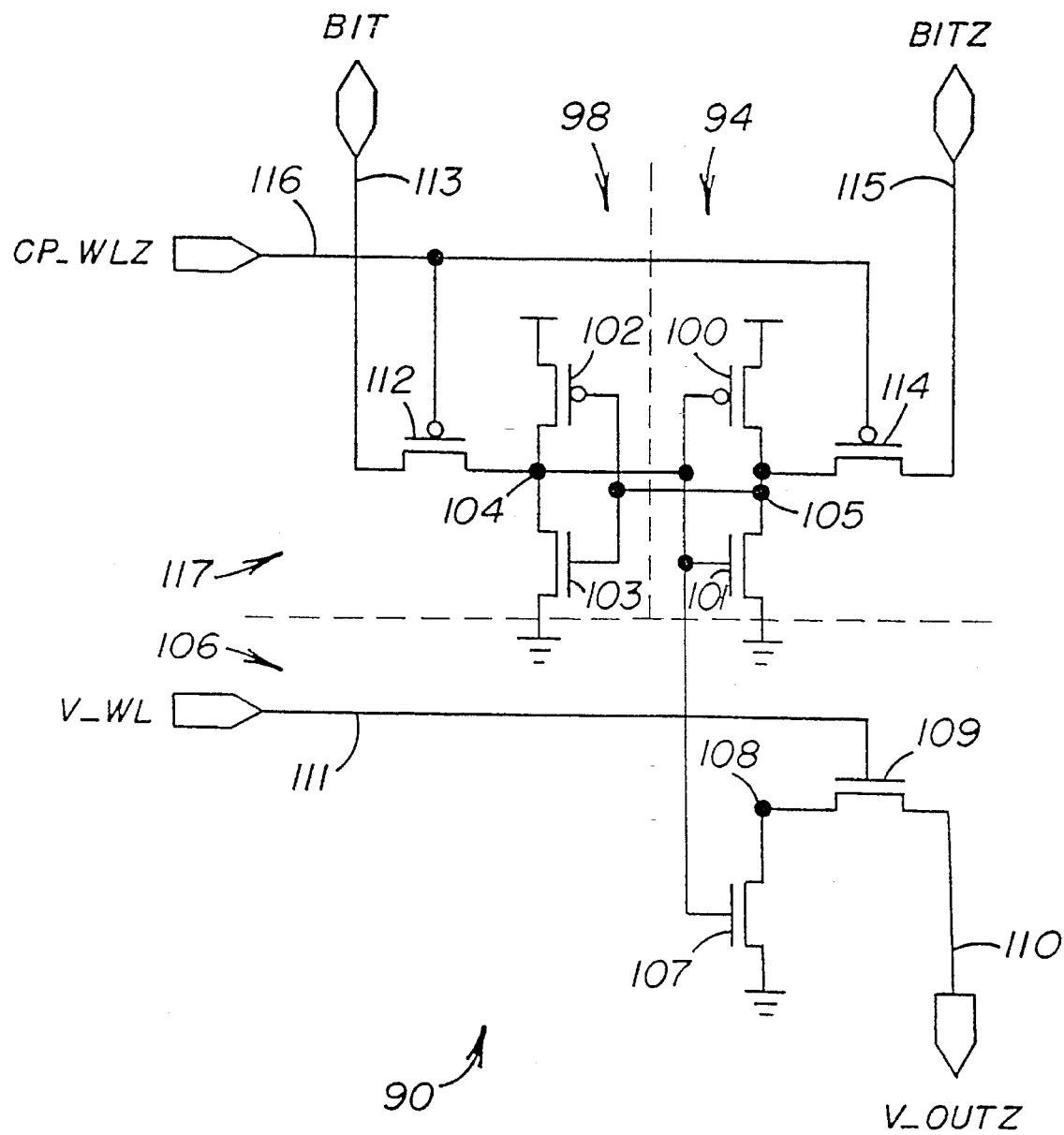
FIG. 3 is a circuit diagram of a memory cell of the SRAM of FIG. 2.
Figure 4:
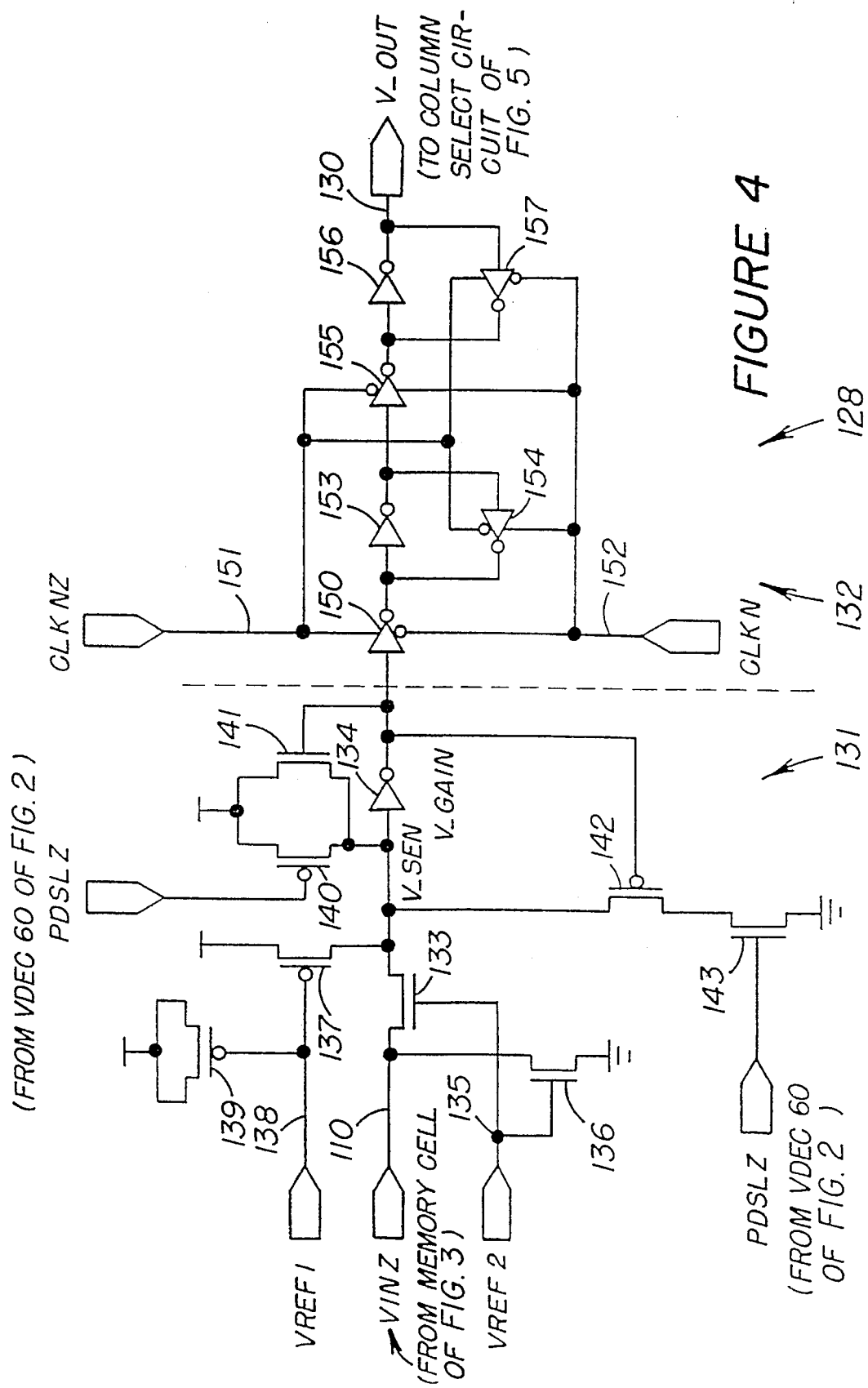
FIG. 4 is a circuit diagram of a single-ended sense amplifier for a column of the memory cells of FIG. 3.
Figure 5:
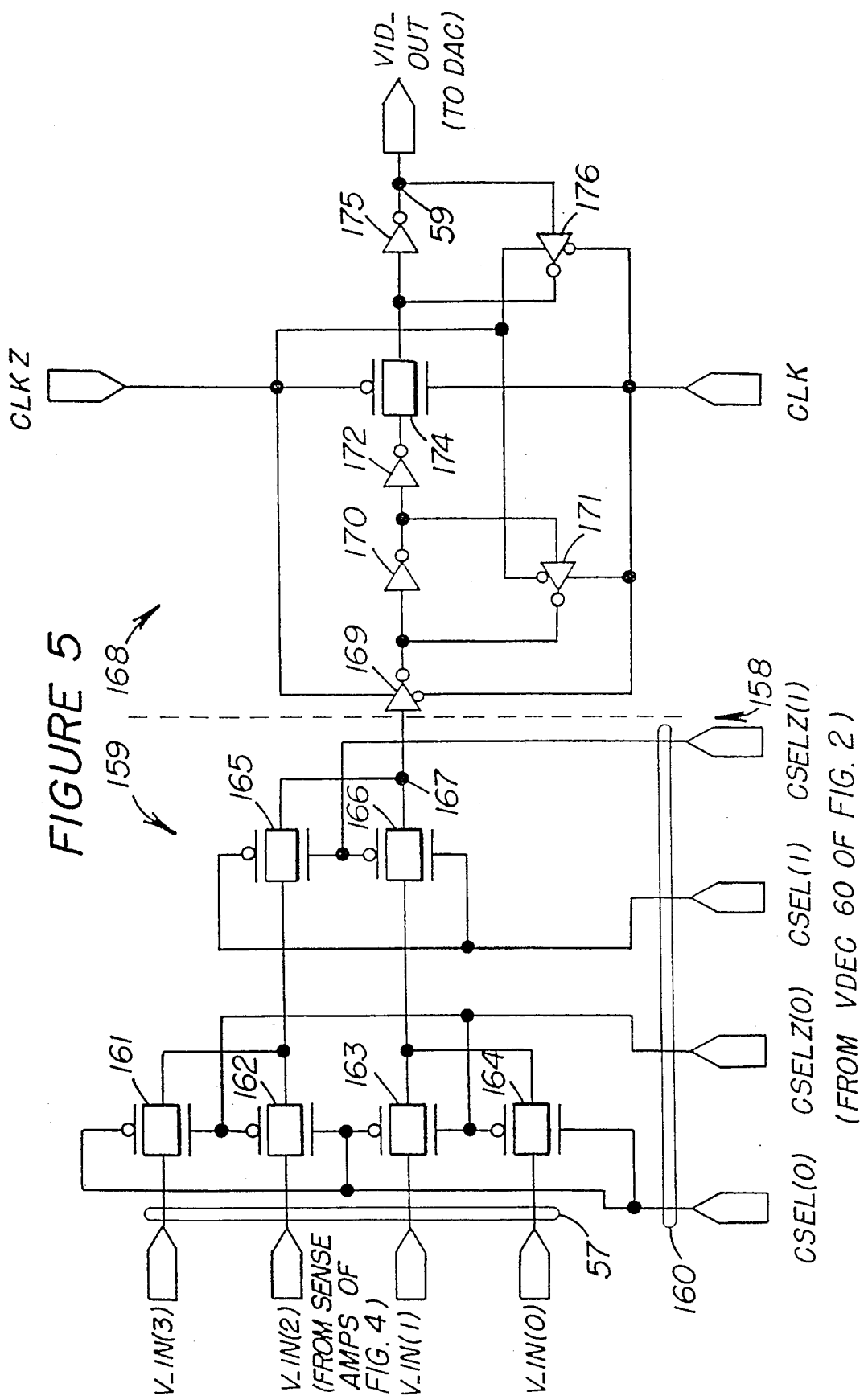
FIG. 5 is a circuit diagram of a column select multiplexer of the SRAM of FIG. 2.

A detailed description of the preferred embodiment of the present invention is provided with respect to FIGS. 1–9. FIGS. 1 and 2 are schematic representations of the architecture of one implementation of the present invention. FIGS. 3–5 illustrate the circuit details of a preferred embodiment. FIGS. 6–9 illustrate the manner in which the preferred system is laid out on the integrated circuit.

I. SYSTEM OVERVIEW

FIG. 1 illustrates an integrated circuit 10 which is used in a display system. The integrated circuit 10 is coupled to a display memory 11 which stores a bit map of an image to be displayed. The bit map may include a plurality of bits per pixel of the image, where the plurality of bits comprise a code indicating the color of the particular pixel in the bit map.

The bits for each pixel are supplied as an input to the integrated circuit 10 across bus 12. The integrated circuit includes a display memory interface 13 which receives the incoming codes from the display memory 11. This interface may perform a variety of functions as known in the art, such as multiplexing and synchronizing with the video clock. These codes are then Supplied as an address across bus 14 to address a color lookup table 15 on the integrated circuit 10. In response to the address on bus 14, the color lookup table 15 is accessed and generates a red code on line 16, a green code on line 17, and a blue code on line 18. The red, green, and blue codes on lines 16, 17, and 18 are supplied as inputs to digital-to-analog converters 19, 20, and 21, respectively. The outputs of the digital-to-analog converters 19, 20, and 21 are supplied as analog signals for the red, green, and blue inputs to a display terminal across lines 22, 23, and 24, respectively.

Thus, the system includes a video display access path from memory 11 over bus 12 to the display memory 13, and over bus 14 to the color lookup table 15. This access path from the display memory 11 through the RGB outputs 22, 23, 24 operates at very high video speeds which are determined by the rate at which pixels must be updated in the display system. Depending on the refresh rate and the resolution of the display terminal, the rate of accessing of the color lookup table through the display path must be greater than 100 MegaHertz for some applications, greater than 125 MegaHertz for other applications, greater than 150 MegaHertz for other applications, and greater than 175 MegaHertz or beyond for other applications.

The integrated circuit 10 also includes a CPU interface 25 which is coupled to the host system bus across bus 26. The CPU interface 25 supplies addresses across bus 27 to the second access path of the color lookup table 15 and communicates data for reading or writing the color lookup table 15 across bus 28. The CPU interface 25 operates asynchronous and independently of the clock which controls the display access path.

Thus, the system further includes a CPU access path which includes the bus 26, the CPU interface 25, and busses 27 and 28 to the color lookup table 15. This CPU access path is used for controlling the contents of the color lookup table 15.

The CPU port is typically used very infrequently. For example, the CPU port may be used only once at system startup, to load appropriate color lookup table values, after which the values need not be changed. The CPU port may also be used for resetting the color lookup table, such as when a switch is made from one video display device to another, for example when replacing an old video monitor with a new one. These functions only take advantage of the write direction of the CPU port. In one mode, the CPU port may even be constructed as a write-only port, within the scope of this invention. There would then be a high-speed write port (CPU) and a low-speed read port (video).

However, it may be desirable to be able to query the content of the color lookup table back to the CPU, for diagnostic purposes. For example, if the actual video output exhibits an unexpected color shift (such as too much blue in a fleshtone) or an odd color translation (such as red grass and green sky), it may prove advantageous to utilize the read direction of the CPU port, to investigate whether the problem lies in the translation data and not in the video monitor itself. The CPU read port may be further utilized for a variety of other diagnostic purposes. Therefore, in the illustrated mode, the CPU port is a read-write port.

Color lookup table integrated circuits, such as the integrated circuit 10 of FIG. 1, are highly integrated, complex parts, which include at least the functionality illustrated in FIG. 1. Other functions may be included as suits the needs of a particular design.

II. COLOR LOOKUP TABLE

FIG. 2 is a schematic diagram of one third of the color lookup table 15 of FIG. 1, either the red third, the green third, or the blue third. For instance, this diagram of FIG. 2 could hold the codes for driving the red DAC 19 of FIG. 1. In this instance, the data connections to the DAC at reference number 50 correspond to bus 16 of FIG. 1. Similarly, the data paths indicated at 51 correspond to at least a portion of the bus 28 of FIG. 1. The CPU address/control lines 52 correspond to bus 27. The video address/control lines 53 correspond to bus 14. It will be understood that the legends "(FIG. 3)", "(FIG. 4)", and "(FIG. 5)" in FIG. 2 suggest that at least a portion of the details of the respective blocks 54, 56, and 58 may be found in the indicated FIGS.

The particular segment of the color lookup table includes an array 70 of eight blocks of memory cells. Each block 54 is sixty-four rows deep by four columns wide. As each block is four columns (bits) wide, four bit lines 55 —one for each column of the block —are connected from the block 54 to block 56. Block 56 includes a set of four sense amplifiers. From the block 56, four data lines 57 are connected to a column select multiplexer 58. The output of the column select multiplexer 58 is supplied on line 59 as one input to the DAC. The bit lines 55 are controlled by the video decode block 60, which is in turn driven by the video address and control signals on bus 53 and by the video clock on line 61. The video decode block 60 controls word lines in the block of memory cells 54, the block 56 of sense amplifiers, and the column select multiplexer,58.

The CPU port includes four bit line pairs 62, each pair coupled to a column of memory cells in the block 54. The bit line pairs 62 are connected to a set of sense amplifiers in block 63. The output of the sense amplifiers in block 63 are supplied across data lines 64 to an I/O driver circuit 65. The I/O driver circuit 65 is coupled across lines 66 to an I/O register 67. The I/O register provides bidirectional data flow to and from the CPU interface across lines 68. The word lines in the memory block 54 as well as the sense amplifier and I/O driver are controlled by the CPU decode block 69 in response to the CPU address and control on lines 52.

FIG. 2 is provided at a heuristic level, leaving out many control lines which are implemented as known by those skilled in the art. FIG. 2 provides merely an overview of the organization of the memory for the purposes of understanding its operation in the context of FIG 1.

Because of the necessarily high-speed operation of the display access path, each single-ended sense amplifier on the display access path, and each column select multiplexer on the display address path, comprise the critical speed path in a memory cell. Accordingly, these circuits are described in detail below.

It can be seen that, for a color lookup table as illustrated in FIG. 1, a memory is provided comprising 256 eight-bit locations for each of the three outputs, for a total of 6,144 memory locations. Therefore, the lookup table comprises a significant portion of the physical surface area of the integrated circuit. Reductions in size of the SRAM cell, therefore, translate into significant improvements in manufacturing yield as well as speed of operation of the integrated circuit.

III. MEMORY CELL AND VIDEO READ PORT

FIG. 3 is a transistor level schematic of one embodiment of one memory cell 90 in a memory block 54 (of FIG. 2). As can be seen, the memory cell 90 includes a first inverter 94 consisting of a p-channel transistor 100 and an n-channel transistor 101, and a second inverter 98 consisting of a p-channel transistor 102 and an n-channel transistor 103. The memory cell includes a true terminal 104 connected to the gates of transistors 100 and 101 (which correspond to the input of the first inverter), and connected to the drains of transistors 102 and 103 (which correspond to the output of the second inverter). Similarly, the memory cell 90 includes a complement terminal 105 connected to the gates of transistors 102 and 103 (which correspond to the input of the second inverter) and connected to the drains of transistors 100 and 101 (which correspond to the output of the first inverter).

The memory cell 90 includes a first, single-ended port 106 including an n-channel transistor 107 having its source connected to ground and its drain connected to an isolated sensing terminal 108. The single-ended port 106 further includes a second n-channel transistor 109 having its source connected to the sensing terminal 108 and its drain connected to the bit line 110 of the single-ended port 106. The gate of transistor 109 is connected to the word line 111 of the single-ended port. The gate of transistor 107 is connected to either the true or complement terminals 104, 105 of the storage element. In the embodiment illustrated, the gate of transistor 107 is connected to the true terminal 104. The single-ended ports of one or more memory cells comprise a fast access port for video display access.

On the bit line 110, the memory cell 90 provides an output signal VOUTZ which is an inverted representation of the bit stored at the true terminal 104 of the memory cell. A non-inverted representation could be provided, if the gate of transistor 107 were coupled to the complement terminal 105, rather than the true terminal 104, or if the transistors 107 and 109 were p-channel rather than n-channel. In this mode, the source of transistor 107 would be coupled to a reference potential VCC rather than to ground. However, as will be explained below, it may be advantageous to provide the inverted representation, because the sense amplifier of FIG. 5 re-inverts the representation, and because n-channel transistors are faster than p-channel. The bit line 110 is one of the lines 55 (of FIG. 2).

The memory cell 90 also includes a second, differential port 117 including p-channel transistor 112 having its source connected to the true terminal 104 of the memory cell and its drain connected to the true bit line 113 of the memory block. The differential port 117 further includes a transistor 114 having its source connected to the complement terminal 105 of the memory cell and its drain connected to the complement bit line 115 of the memory block. The gates of transistors 112 and 114 are connected to the word line 116 of the CPU access path. Because the pass transistors 112 and 114 in this differential port 117 are p-channel, the word line 116 is active low. The differential ports of one or more memory cells comprise a CPU access port, which does not necessarily need to be as fast as the fast access port, as the CPU access port will be used only for inspecting and changing the colors represented in the color lookup table, which does not need to be performed at video speed.

In the configuration discussed with reference to FIG. 2, a column of memory cells as illustrated in FIG. 3 share the bit lines 113 and 115 of the CPU access path and the bit line 110 of the display access path. Similarly, a row of memory cells in the memory array 70 of FIG. 2 shares the CPU word line 116 and the video word line 111.

It can be seen that the memory cell shown in FIG. 3 consists of eight transistors, four of which are p-channel, and four of which are n-channel. This provides a balance of transistors which can be beneficially relied upon in laying out the memory cell in an integrated circuit as illustrated below.

The following Table 1 lists exemplary values for the channel lengths and widths for the various components of FIG. 3. All lengths and widths are listed in microns, for example.

TABLE 1

(Components of FIG. 3)

| Component | Channel Width | Channel Length |
|---|---|---|
| 100 | 3.9 | 1.0 |
| 101 | 3.0 | 2.4 |
| 102 | 3.9 | 1.0 |
| 103 | 3.0 | 2.4 |
| 107 | 9.4 | 1.0 |
| 109 | 3.6 | 1.0 |
| 112 | 3.4 | 1.0 |
| 114 | 3.4 | 1.0 |

IV. SENSE AMPLIFIER

FIG. 4 illustrates one embodiment of one single-ended sense amplifier 128 of a block 56 of single-ended sense amplifiers (of FIG. 2). The single-ended sense amplifier 128 receives input signal VINZ on bit line 110 from the memory block (of FIG. 3), and is single-ended in that the signal VINZ is not sensed differentially with respect to another input signal.

The signal VINZ will be understood to be the same as signal VOUTZ, when thought of as input to the sense amplifier rather than as output of the memory cell. The sense amplifier 128 provides an output signal $V_{13}$ OUT on line 130 to a column select multiplexer 58. The line 130 is one of the lines 57 (of FIGS. 2 and The sense amplifier of FIG. 4 consists primarily of a sensing circuit 131 and a master/slave flip-flop 132. The sensing circuit 131 is described in part in the above-referenced, commonly-assigned U.S. patent application entitled CMOS CLAMP CIRCUITS, which application is incorporated by reference as if fully set forth herein.

The sense amplifier consists primarily of cascode transistor 133 having its source coupled to line 110 and its drain connected to the input of sensing inverter 134. The gate of transistor 133 is connected to a reference potential 135 of about $2V_T$, or twice the threshold voltage of the transistor. Also, pull-down transistor 136 has its drain connected to the input line 110, its source connected to ground, and its gate connected to the reference potential 135.

The input of the sensing inverter 134 is referred to as terminal $V_{13}$ SEN for simplicity. At terminal $V_{13}$ SEN, a p-channel transistor 137 is connected in a current source configuration with its source coupled to a reference potential and its drain connected to the $V_{13}$ SEN terminal. The gate of current source transistor 137 is coupled to a reference potential 138 which biases the current source transistor to produce a current $I_0/2$ which is approximately ½ of the average current ($I_0$) on the bit line 110, when the bit line is pulled down by an accessed memory cell. Terminal 138 is coupled to the gate of p-channel transistor 139, which is connected in a capacitor configuration to the power supply reference potential. The combination of transistors 137 and 133 and 136 produces a current at the $V_{13}$ SEN terminal equal to $\pm I_0/2$, depending on the state of the bit line 110.

A clamping circuit, consisting of p-channel transistor 140, n-channel transistor 141, p-channel transistor 142, and n-channel transistor 143, is coupled around the sensing inverter 134. The video decode block 60 (of FIG. 2) supplies an active-low power-down signal PDSLZ to the clamping circuit to provide a sleep mode operation of the sense amplifier.

When the clamping circuit is activated by the power-down signal PDSLZ, the clamping circuit puts the sense amplifier to sleep in order to reduce power consumption of the apparatus. In one mode, the sleep mode signal PDSLZ may be provided as a function of the column addressing, such that only those columns which are addressed will have powered sense amplifiers, or more specifically, sensing inverters 134. Thus, the sleep mode signal PDSLZ may be created by simply decoding the low order two bits of the video address signal provided on line 53 (of FIG. 2), each of the four sense amps within each block 56 (of FIG. 2) having a unique decoding of the two bits.

In the clamping circuit, the terminal $V_{13}$ SEN is coupled to the source of transistor 142, and to the drain of transistor 140 and to the source of transistor 141. The source of transistor 140 and the drain of transistor 141 are connected to the positive reference potential. The gate of transistor 140 is connected to the PDSLZ signal. The gate of transistor 141 is connected to the output of the sensing inverter 134 which is referred to as $V_{13}$ GAIN. Similarly, the $V_{13}$ GAIN terminal is coupled to the gate of transistor 142. The drain of transistor 142 is coupled to the drain of transistor 143. The source of transistor 143 is coupled to ground. The gate of transistor 143 is coupled to the sleep mode signal PDSLZ. When the PDSLZ signal is active (low), transistor 140 is on and transistor 143 is off. This causes the input to the sense amplifier 134 to be pulled up and substantially no current to flow on the sense inverter, and disables the clamping transistor 142. During normal operation, the PDSLZ signal is inactive (high) and turns on transistor 143, allowing operation of the clamping transistors 142 and 141. In this state, the pull-up transistor 140 is turned off.

This circuit serves to translate the current at VINZ to a small voltage at $V_{13}$ SEN, and the small voltage at $V_{13}$ SEN to a large voltage at $V_{13}$ GAIN, at a very high speed. Small fluctuations in the current at VINZ are sensed single-endedly, rather than differentially, to gain speed advantage. The terminal $V_{13}$ GAIN is coupled to a master/slave flip-flop 132. The master/slave flip-flop includes a first clocked inverter 150 receiving the active low video clock CLKNZ and a complement CLKN of the video clock across lines 151 and 152, respectively. The output of the clocked inverter 150 is connected to a storage element consisting of inverter 153 and clocked inverter 154. The clocked inverter 154 is clocked in the opposite phase relationship as clocked inverter 150. The output of inverter 153 is also connected to a clocked inverter 155. Clocked inverter 155 is clocked in the opposite phase relationship to inverter 150. The output of inverter 155 is coupled to a second data storage element including inverter 156 and clocked inverter 157. The clocked inverter 157 is clocked in the same phase relationship as inverter 150. The sense amplifier 128 provides an output on line 130 sampled at very high speed determined by the clock rate on lines 151 and 152.

The following Table 2 lists exemplary values for the channel lengths and widths for the various components of FIG. 4 where the inverters include two transistors each. All lengths and widths are listed in microns, for example.

TABLE 2

| Component | | Channel Width | Channel Length |
|---|---|---|---|
| 133 | | 40.0 | 1.0 |
| 134 | | 4.0 | 1.0 |

TABLE 2-continued (Components of FIG. 4)

| Component | | Channel Width | Channel Length |
|---|---|---|---|
| | and | 8.1 | 1.0 |
| 136 | | 3.0 | 10.6 |
| 137 | | 11.6 | 1.2 |
| 139 | | 4.0 | 1.2 |
| 140 | | 4.0 | 1.0 |
| 141 | | 3.0 | 1.0 |
| 142 | | 6.0 | 1.0 |
| 143 | | 4.0 | 1.0 |
| 150 | | 4.0 | 1.0 |
| | and | 8.0 | 1.0 |
| 153 | | 4.0 | 1.0 |
| | and | 8.0 | 1.0 |
| 154 | | 3.6 | 1.0 |
| | and | 3.6 | 1.0 |
| 155 | | 4.0 | 1.0 |
| | and | 8.0 | 1.0 |
| 156 | | 6.0 | 1.0 |
| | and | 12.0 | 1.0 |
| 157 | | 3.6 | 1.0 |
| | and | 3.6 | 1.0 |

V. COLUMN SELECT MULTIPLEXER AND FLIP-FLOP

FIG. 5 illustrates the column select circuitry 158 operating in the critical video path. A column select multiplexer 159 receives input signals $V_{13}$ IN(0:3) on lines 57 from four sense amplifiers for a given block 54 of the memory array 70 (of FIG. 2). Each line 57 corresponds to a respective line 130 of one sense amplifier (as shown in FIG. 4). Each input signal $V_{13}$ IN will be understood to be the same as a respective signal $V_{13}$ OUT, when thought of as input to the column select multiplexer 159 rather than as output of a sense amplifier.

The multiplexer 159 also receives true and compliment versions of a two-bit column select signal CSEL(0-1) across lines 160. The signals CSEL are provided from the video decode block (of FIG. 2). The column select multiplexer 159 consists of a first column of pass gates 161, 162, 163, and 164 which decode the signal CSEL(0) (both the non-inverted representation CSEL and the inverted representation CSELZ) to select two of the four input signals. A second column of pass gates 165 and 166 further selects one of the two selected input signals in response to the signal CSEL(1) (again, both versions). The output of the second column of pass gates on line 167 is supplied as input to a master/slave flip-flop 168.

The master/slave flip-flop 168 consists of a first clocked inverter 169 having its output connected to a storage element consisting of an unclocked inverter 170 and a clocked inverter 171. The output of the storage element is connected to an unclocked inverter 172, then through pass gate 174 to an output storage element consisting of an unclocked inverter 175 and a clocked inverter 176. The clocked inverters 169 and 176 are clocked on the same phase relationship. The clocked inverter 171 and the pass gate 174 are clocked on the opposite phase relationship with respect to inverter 169. The video output signal VID—OUT is supplied on line 59 as input to a digital-to-analog converter for high speed conversion, such as for driving a respective red, green, or blue beam within a cathode ray tube (not shown). The circuits illustrated in FIGS. 3, 4, and 5 have been tested at greater than 200 MegaHertz.

The following Table 3 lists exemplary values for the channel lengths and widths for the various components of FIG. 5, where the respective inverters include two transistors each. All lengths and widths are listed in microns, for example.

TABLE 3

(Components of FIG. 5)

| Component | | Channel Width | Channel Length |
|---|---|---|---|
| 161 | | 12.0 | 1.0 |
| | and | 6.0 | 1.0 |
| 162 | | 12.0 | 1.0 |
| | and | 6.0 | 1.0 |
| 163 | | 12.0 | 1.0 |
| | and | 6.0 | 1.0 |
| 164 | | 12.0 | 1.0 |
| | and | 6.0 | 1.0 |
| 165 | | 12.0 | 1.0 |
| | and | 6.0 | 1.0 |
| 166 | | 12.0 | 1.0 |
| | and | 6.0 | 1.0 |
| 169 | | 4.0 | 1.0 |
| | and | 8.0 | 1.0 |
| 170 | | 4.0 | 1.0 |
| | and | 8.0 | 1.0 |
| 171 | | 3.6 | 1.0 |
| | and | 3.6 | 1.0 |
| 172 | | 6.0 | 1.0 |
| | and | 12.0 | 1.0 |
| 174 | | 12.0 | 1.0 |
| | and | 4.0 | 1.0 |
| 175 | | 15.0 | 1.0 |
| | and | 30.0 | 1.0 |
| 176 | | 3.6 | 1.0 |
| | and | 3.6 | 1.0 |

VI. MEMORY CELL LAYOUT

Figure 6:
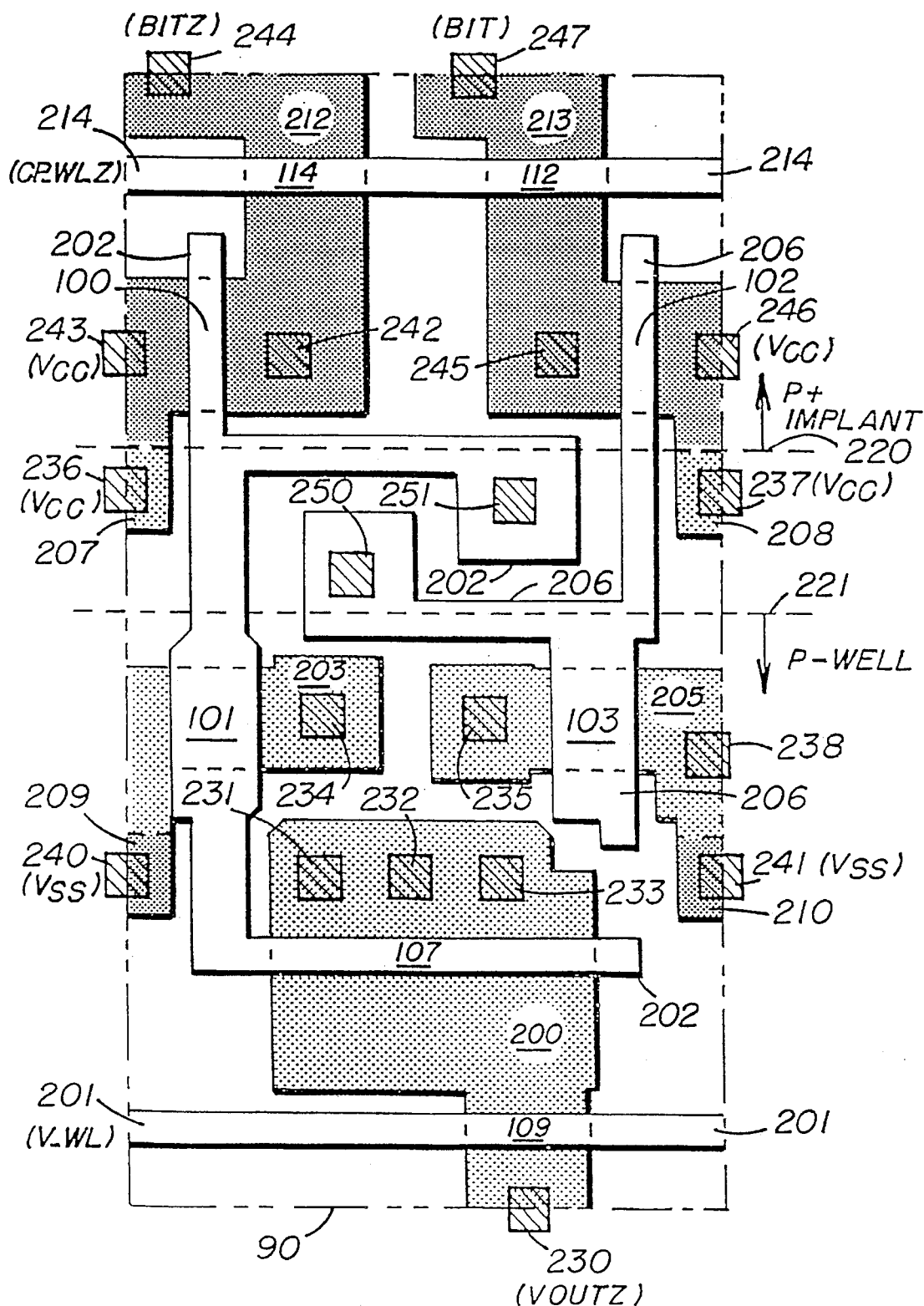
FIG. 6 is a layout diagram of the n-LOCOS, p-LOCOS and polysilicon layers of the SRAM cell of FIG. 3.
Figure 7:
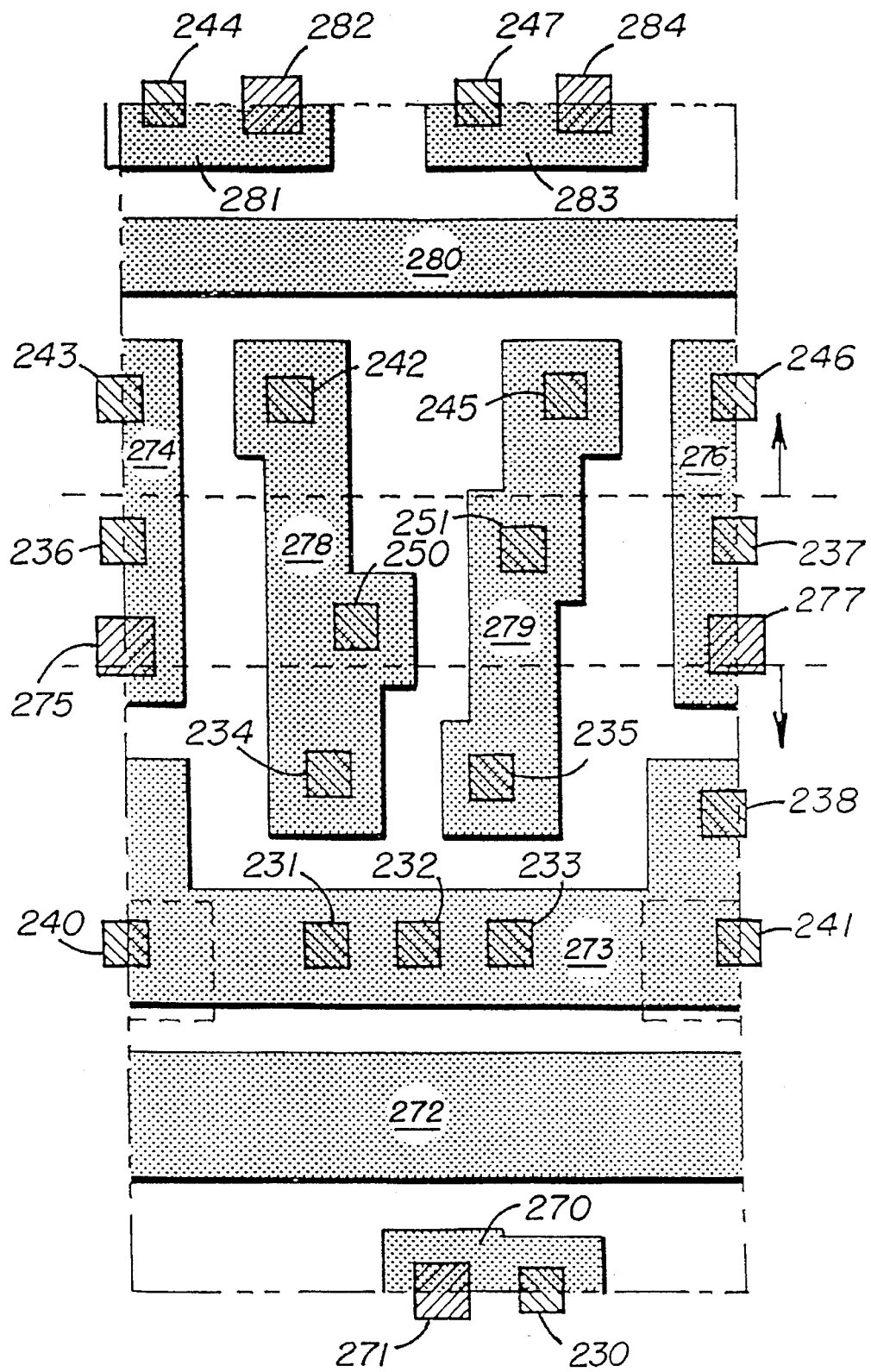
FIG. 7 is a layout diagram of the metal one layer of the SRAM cell of FIG. 3.
Figure 8:
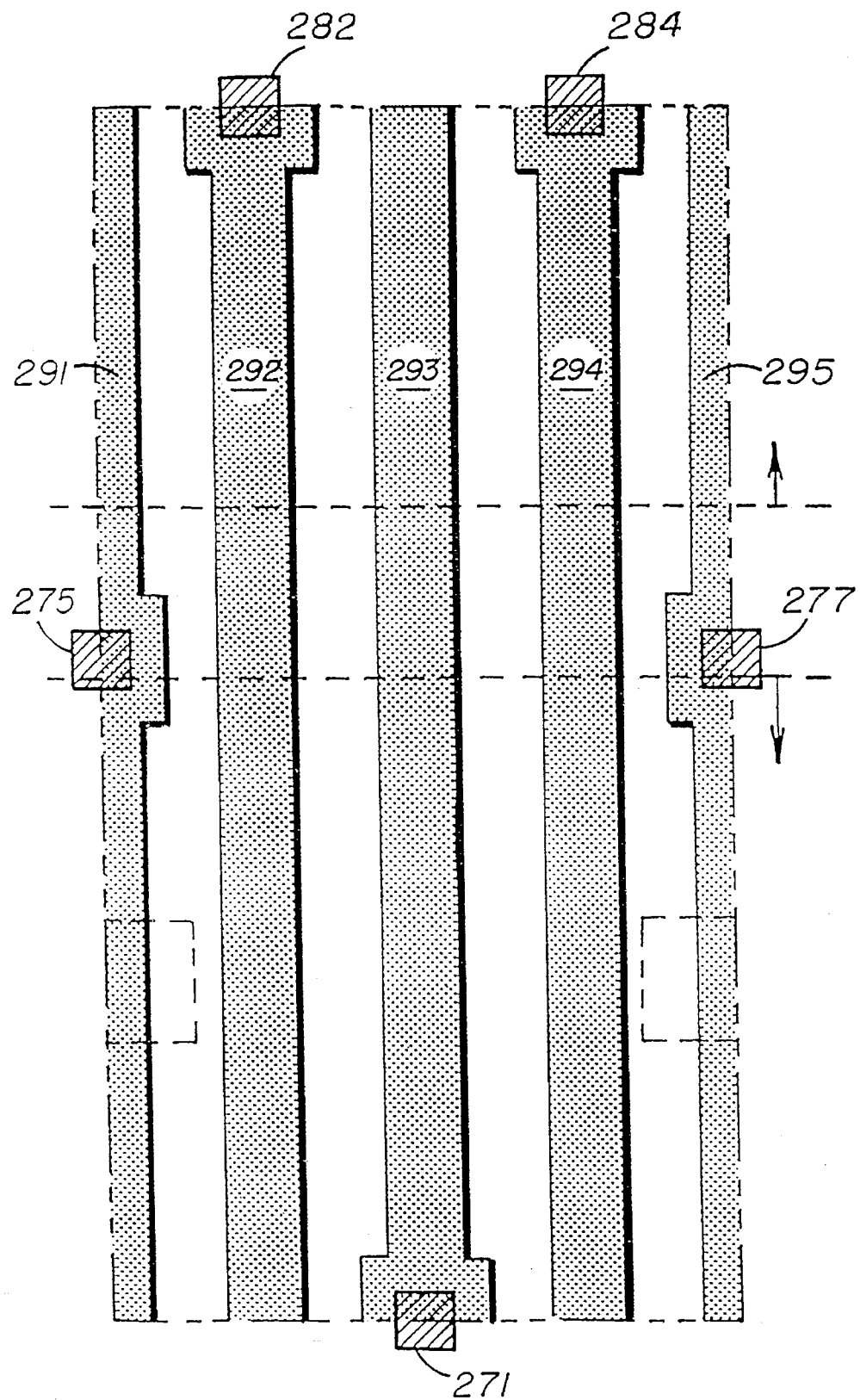
FIG. 8 is a layout diagram of the metal two layer of the SRAM cell of FIG. 3.

The layout of the memory cell illustrated in FIG. 3 has been optimized for small size and high speed operation as illustrated in FIGS. 6–9. FIG. 6 provides the n-LOCOS, p-LOCOS, and polysilicon layout with points of contact to a first metal layer. FIG. 7 illustrates the layout of the first metal layer with contacts to the elements shown in FIG. 6 and to a second metal layer. FIG. 8 illustrates the layout of the second metal layer with via contacts to the first metal layer of FIG. 7. FIGS. 6–8 are a scale drawing of a memory cell layout which is smaller than 17 by 34 microns with a 1 micron minimum channel length process.

A. n-LOCOS, p-LOCOS, AND POLYSILICON LAYER

As shown in FIG. 6, the layout of the SRAM cell 90 includes a first n-LOCOS region 200. A poly word line 201 intersects the first n-LOCOS region 200 to form transistor 109. A poly region 202 intersects region 200 to form transistor 107. As can be seen, transistor 109 has a channel width of 3.6 microns and a channel length of 1 micron. Transistor 107 has a channel width of 9.4 microns and a channel length of 1 micron.

A second n-LOCOS region 203 is also formed in the cell. This region is intersected by the poly region 202 to form transistor 101. As can be seen, transistor 101 has a channel 3 microns wide by 2.4 microns long. A third n-LOCOS region 205 is intersected by a poly region 206 to form transistor 103. As can be seen, transistor 103 is an n-channel transistor having a channel width of 3 microns and a channel length of 2.4 microns. Fourth and fifth n-LOCOS regions 207 and 208 are formed to provide substrate contacts at which a potential VCC may be applied.

As can be seen, the lower half of the layout is implemented in a p well, which is separated from the remainder of the layout by a guard or buffer region which lies between the lines 220 and 221. This p well includes the entire region below the p well buffer line 221 in FIG. 6. The p-LOCOS regions 209 and 210 are formed to provide well contacts at which a reference potential VSS may be applied. Dividing the cell substantially in stripes —a stripe of p well and a stripe outside the p well —provides the ability to layout a plurality of cells with a long, stripe-shaped p well, as will be explained below with regard to FIG. 9.

In FIG. 6, above the p well buffer line 220 are the p=LOCOS regions 212 and 213. The p-LOCOS region 212 is intersected by the poly region 202 to form p-channel transistor 100, which has a 3.9 micron channel width and a 1 micron channel length. Also, p-LOCOS region 212 is intersected by the poly word line 214 to form p-channel pass transistor 114, which has a 3.4 micron channel width and a 1 micron channel length. Similarly, the p-LOCOS region 213 is intersected by the poly region 206 to form p-channel transistor 102 which has a 3.9 micron channel length and a 1 micron channel width. Also, the n-LOCOS region 213 is intersected by the poly word line 214 to form p-channel pass transistor 112 which has a 3.4 micron channel length and a 1 micron channel width.

A variety of metal one contacts are formed in connection with the integrated circuit layer of FIG. 6. In FIGS. 6–8, it will be understood that all contacts which are shown overlapping the cell boundaries are intended to be shared with adjacent memory cells (not shown), in the interest of saving surface area of the silicon, to minimize the size of the integrated circuit. It will be further understood that the n-LOCOS, p-LOCOS, and polysilicon regions which extend to the boundary are of unitary construction with adjoining such regions in the adjacent memory cells, as explained below. It will be understood that a contact which is connected to one such region in a first cell will be shared by an adjoining second cell, by virtue of the unitary construction of the adjoining regions between the cells. In one mode, the contact may be formed to overlap the boundary of the cells.

A first shared contact 230 is formed in the n-LOCOS region 200. The n-LOCOS region 200 also includes metal one contacts 231, 232, and 233. The n-LOCOS region 202 includes a contact 234. The n-LOCOS region 205 includes a contact 235 and a shared contact 238. The n-LOCOS region 207 includes a shared contact 236, while the n-LOCOS region 208 includes a shared contact. 237.

The p-LOCOS region 209 includes another shared contact 240, and the p-LOCOS region 210 includes another shared contact 241. The p-LOCOS region 212 includes a contact 242 and two shared contacts 243 and 244. The p-LOCOS region 213 includes a contact 245 and two shared contacts 246 and 247.

The polysilicon region 206 includes a contact 250, and the polysilicon region 202 includes a contact 251.

The following Table 4 identifies correspondences between the metal one contacts shown in FIGS. 6–8 and the transistor terminals shown in FIG. 3.

TABLE 4

(Correspondences Between Metal One Contacts and Terminals)

| Contact No. | Transistor Terminal(s) |
|---|---|
| 230 | 109's drain |
| 231 | 107's source |
| 232 | 107's source |
| 233 | 107's source |

TABLE 4-continued (Correspondences Between Metal
One Contacts and Terminals)

| Contact No. | Transistor Terminal(s) |
| --- | --- |
| 234 | 101's drain |
| 235 | 103's drain |
| 236 | substrate contact |
| 237 | substrate contact |
| 238 | 103's source |
| 240 | well contact |
| 241 | well contact |
| 242 | 100's drain, 114's drain |
| 243 | 100's source |
| 244 | 114's source |
| 245 | 102's drain, 112's drain |
| 246 | 102's source |
| 247 | 112's source |
| 250 | 102's gate, 103's gate |
| 251 | 100's gate, 101's gate, 107's gate |

It will be understood that one manner of forming the circuit of FIG. 3 is to: first, form the n-LOCOS, p-LOCOS, and polysilicon regions of FIG. 6, with their contact members, and with insulation (not shown) between the polysilicon and n− and p+ diffusion; second, form an insulating layer on top of those regions, except for the contacts; third, form the metal one layer of FIG. 7 to connect various ones of the contacts of FIG. 6; fourth, form another insulating layer; and fifth, form the metal two layer of FIG. 8, to connect various ones of the contacts of FIG. 7. These and other equivalent methods and orders are within the scope of this invention.

B. METAL ONE LAYER

FIG. 7 shows the layout of the metal one layer of the circuit of FIG. 3. As with FIG. 6, the contacts which overlap the memory cell's boundaries are shared with adjacent cells, and the metal elements which extend to the boundaries are of unitary construction with adjoining metal elements in adjacent memory cells. It will be further appreciated that in FIGS. 6–8, like reference numerals indicate same elements (contacts) which extend between the layers. To the extent possible, applicants have illustrated the layers such that FIGS. 6–8 may be superimposed, to aid in understanding the various connections.

Applicants have, wherever possible, shown the first set of contacts (vias) (of FIG. 6) in a first size and a second set of contacts (which begin in the metal one layer of FIG. 7) in a second, larger size. This does not necessarily mean that the contacts must be formed in two different sizes, however, although in one mode they may be so formed. The second set of contacts are those which connect the metal one layer to the metal two layer, as will be described below.

The metal one layer includes a first metal one element 270 which connects the contact 230 from the layer of FIG. 6 to another contact 271 of the second set, to provide access to the output of transistor 109 (of FIG. 3). A second metal one element 272 is provided, which corresponds to the video word line. A third metal one element 273 connects the contacts 240, 231, 232, 233, 234, 241, and 238, to provide VSS to the sources of transistors 107, 101, and 103 (of FIG. 3). The third metal one element 273 contacts the source of transistor 101, in that the n-LOCOS region 203 (of FIG. 6) extends into a next memory cell immediately to the left, and is of unitary construction with that memory cell's n-LOCOS region 205, wherein the third metal one element 273 is connected to the contact 238 of the next memory cell to the left.

A fourth metal one element 274 connects the contacts 236 and 243 to a contact 275 in the second set, to provide VCC to the source of transistor 101 (of FIG. 6). A fifth metal one element 276 connects the contacts 237 and 246 to a contact 277 in the second set, to provide VCC to the source of transistor 102 (of FIG. 6). A sixth metal one element 278 connects the contacts 234, 250, and 242 together, while a seventh metal one element 279 connects the contacts 235, 251, and 245 together, thereby connecting the transistors 100, 101, 102, and 103 as shown in FIG. 6 as opposing inverters.

An eighth metal one element 280 is also provided, which corresponds to the CPU word line. A ninth metal one element 281 connects the contact 244 to a contact 282 of the second set, while a tenth metal one element 283 connects the contact 247 to a contact 284 of the second set, to connect the CPU bit lines to the sources of transistors 114 and 112, respectively.

C. METAL TWO LAYER

The metal two layer is illustrated in FIG. 8. A first metal two element 291 supplies VCC and is connected to the contact 275, and a second metal two element 292 supplies one CPU bit line and is connected to the contact 282. A third metal two element 293 supplies the video bit line and is connected to the contact 271, and a fourth metal two element 294 supplies the other CPU bit line and is connected to the contact 284. Finally, a fifth metal two element 295 supplies VCC and is connected to the contact 277. It will be understood that the first metal two element 291 of a given memory cell may be of unitary construction with the fifth metal two element 295 of a next adjacent memory cell to the left (not shown), and that the contact 275 of the given memory cell may. be the same physical contact as the contact 277 of the adjacent memory cell.

Please now refer to FIGS. 3 and 8. The power supply VCC may be provided on the first metal two line 291 and the fifth metal two line 295, to the sources of transistors 100 and 102, respectively. The bidirectional signal BITZ on line 115 (the source of transistor 114) is provided on the second metal two element 292. The output Signal VOUTZ on line 110 (the drain of transistor 109) is provided on the third metal two element 293. The bidirectional signal BIT on line 113 (the source of transistor 112) is provided on the fourth metal two element 294.

Please refer now to FIGS. 3, 6, and 7. The power supply signal VSS, which may be ground, is provided on the third metal one element 273. The input signals $CP_{13}$ WLZ and $V_{13}$ WL are provided on the metal one elements 280 and 272, respectively, which are respectively connected to the polysilicon elements 214 and 201 by contacts (not shown) occurring periodically along the extent of the memory array. It is not mandatory that each memory cell include its own such contacts; rather, such contacts are provided at such intervals as allow adequate signal transfer with sufficiently minimized resistance and capacitance, as explained below.

VII. MEMORY BLOCK LAYOUT

Figure 9:
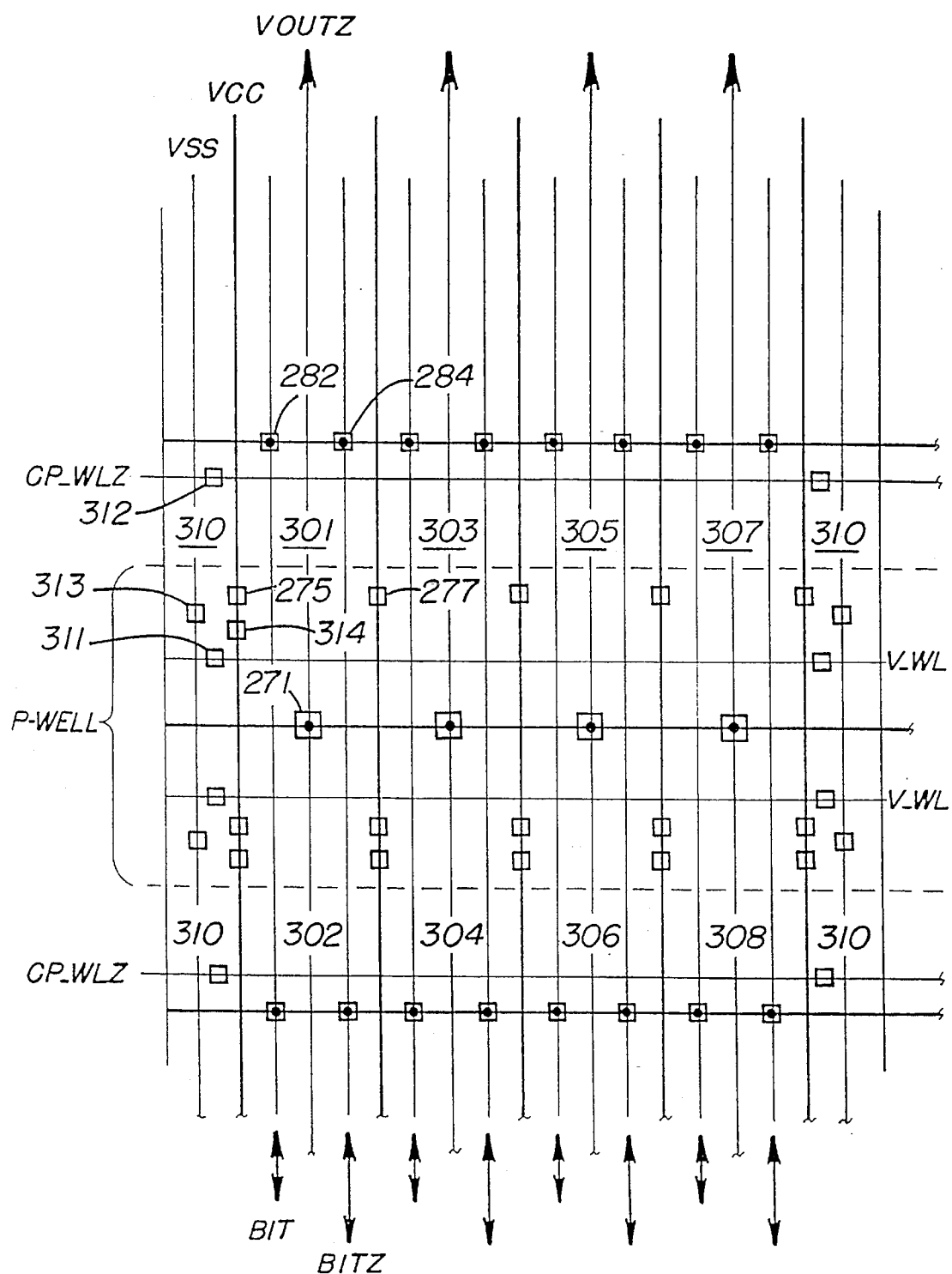
FIG. 9 is a layout diagram of a plurality of memory cells, each of which is implemented as shown in FIGS. 6–8.

FIG. 9 illustrates the layout of eight adjacent or contiguous memory cells 301–308 according to FIGS. 6–8. The cells 301, 303, 305, and 307 comprise one row (having four columns) of the sixty-four rows within one memory block 54 of the memory array 70 illustrated in FIG. 2. In FIG. 9, the thicker lines denote memory cell boundaries.

As will be understood from FIGS. 6–9, each memory cell is laid out such that two cells in left-right adjacent positioning (i.e. 301 and 303) may share the contacts and lines for the CPU access paths ($CP_{13}$ WLZ), the video access path ($V_{13}$ WL), and the operating potential (VSS). Similarly, the memory cells are laid out such that two memory cells in up-down adjacent positioning (i.e. 301 and 302) are mirror images of each other as reflected about the centermost thick line, in order that they may share the contacts and lines for the bit outputs (VOUTZ, BIT, and BITZ) and the reference potential (VCC).

The sharing of the contacts 271 and 230 (of FIG. 7) is of central importance in reducing capacitances in the design, to improve signal transfer characteristics of the VOUTZ signal which goes to a DAC (of FIG. 1).

The poly lines and metal lines, which together form the video word lines $V_{13}$ WL and the CPU word lines $CP_{13}$ WLZ, are connected together only in strapping cells 310. Thus, each strapping cell 310 includes a contact 311 from the metal one video word line 272 (of FIG. 7) to the poly video word line 201 (of FIG. 6). Each strapping cell further includes a contact 312 from the metal one CPU word line 280 (of FIG. 7) to the poly CPU word line 214 (of FIG. 6). Connection to the VSS metal one line 273 (of FIG. 7) is provided in each strapping cell at contact 313. In addition, FIG. 9 illustrates how the substrate contacts 314 are shared between adjacent cells in the layout. The substrate contacts 314 correspond to the contacts 240 and 241 (of FIG. 6).

Furthermore, it can be seen that cells 301 and 302 are formed such that only a single, wide-stripe p well is required. This allows formation of a large p well in the n-type substrate, minimizing the requirement for buffer regions around p wells and the like, which cause increase in size and complexity of the layout. Of course, for integrated circuits manufactured using n-type substrates, the same type of layout strategy applies using n wells which would encompass the groups of four p-channel transistors and adjacent cells.

The above-detailed design allows an efficient, compact layout of the memory array, with the number of metal contacts reduced through optimal sharing of them between adjacent memory cell columns, and with the number of wells reduced through mirror imaging of adjacent memory cell rows. Reduced integrated circuit size translates to greater manufacturing yields for reduced unit cost, and also to higher circuit operating speed critical to effective use of color lookup tables.

VIII. CONCLUSION

As can be seen, a dual port static random access memory has been disclosed which has been optimized for the color lookup table application. This system provides very small layout and high speed operation of the video port while tolerating lower speed accessing by a CPU port for updating the contents of the lookup table.

The memory of the present invention allows integration of a color lookup table which is significantly smaller than all prior art devices, rendering higher yields and greater speeds.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. On an integrated circuit, a circuit including a first memory cell having a left edge, a right edge, an upper edge, and a lower edge and having an upper part adjacent to said upper edge and a lower part adjacent to said lower edge, wherein the first memory cell comprises:

a substrate of a first doping type;
   a first layer of regions including:
      a well of a second doping type located in said lower part of said memory cell;
      a first region and a second region of the second doping type, said first region extending to the left and upper edges, and said second region extending to the upper and right edges;
      a third region, a fourth region, and a fifth region of the first doping type, said third region in said lower part and extending from said left edge, said fourth region in said lower part and extending from said right edge, said fifth region in said lower part and extending from said lower edge;
   first, second, third, and fourth polysilicon regions;
   said first polysilicon region extending across said first region, said third region and said fifth region; said second polysilicon region extending across said second region and said fourth region;
   said third polysilicon region extending from said left edge to said right edge and extending across said fifth region;
   said fourth polysilicon region extending from said left edge to said right edge and extending across said first and second regions; and
   a first set of contacts including:
      a first contact connected to said first polysilicon region;
      a second contact connected to said second polysilicon region;
      a third contact connected to said first region;
      a fourth contact connected to said first region and located astride said left edge;
      a fifth contact connected to said first region and located astride said upper edge;
      a sixth contact connected to said second region;
      a seventh contact connected to said second region and located astride said right edge;
      an eighth contact connected to said second region and located astride said upper edge;
      a ninth contact connected to said third region;
      a tenth contact connected to said fourth region;
      an eleventh contact connected to said fourth region and located astride said right edge;
      a twelfth contact connected to said fifth region and located astride said lower edge; and
      a thirteenth contact connected to said fifth region;
   a second layer of regions including:
      a first metal region extending from said upper edge and connecting said fifth contact to a fourteenth contact;
      a second metal region extending from said upper edge and connecting said eighth contact to a fifteenth contact;

a third metal region extending from said left edge to said right edge and located in said upper part of said memory cell;

a fourth metal region extending from said left edge and connecting said fourth contact to a sixteenth contact;

a fifth metal region connecting said second, third, and ninth contacts;

a sixth metal region connecting said first, sixth, and tenth contacts;

a seventh metal region extending from said right edge and connecting said seventh contact to a seventeenth contact;

an eighth metal region extending from said left edge to said right edge and connecting said eleventh and thirteenth contacts;

a ninth metal region extending from said left edge to said right edge and located in said lower part of said memory cell;

a tenth metal region extending from said lower edge and connecting said twelfth contact to an eighteenth contact; and a third layer of regions, each region extending from said upper edge to said lower edge, including:

an eleventh metal region connected to said sixteenth contact;

a twelfth metal region connected to said fourteenth contact;

a thirteenth metal region connected to said eighteenth contact;

a fourteenth metal region connected to said fifteenth contact; and a fifteenth metal region connected to said seventeenth contact.

2. The circuit of claim 1, further comprising:

a second memory cell, adjacent to and substantially a mirror image of the first memory cell about the upper edge of the first memory cell.

3. The circuit of claim 1, further comprising:

a second memory cell substantially identical to the first memory cell, wherein the first and second memory cells are adjacent each other at the right edge of the first memory cell and at the left edge of the second memory cell.

4. The circuit of claim 3, further comprising:

a third memory cell and a fourth memory cell adjacent each other, and adjacent to and substantially a mirror image of the first and second memory cells about the upper edges of the first and second memory cells.

5. A memory cell on an integrated circuit, the integrated circuit having a substrate of a first doping type and within the substrate a well of a second doping type the memory cell having first, second, third, and fourth edges, and the memory cell having an upper part and a lower part, said well located in said lower part, and comprising:

A) a static memory device including:

a first polysilicon member (202) extending across portions of said upper and lower parts, and having a first contact (251);

a second polysilicon member (206) extending across portions of said upper and lower parts, and having a second contact (250)

said upper part, including:

a first region (212) of the second doping type and extending to the first and second edges;

third (242), fourth (243), and fifth (244) contacts connected to the first region, the fourth and fifth contacts being astride the first and second edges, respectively;

a portion of the first polysilicon member being in proximity with a first portion of the first region to form a first transistor (100) of a first channel type, the third and fourth contacts being first and second channel terminals of the first transistor, respectively;

a second region (213) of the second doping type and extending to the second and third edges sixth (245), seventh (246), and eighth (247) contacts connected to the second region, the seventh and eighth contacts being astride the third and second edges, respectively, and a portion of the second polysilicon member being in proximity with a first portion of the second region to form a second transistor (102) of the first channel type, the sixth and seventh contacts being first and second channel terminals of the second transistor, respectively;

said lower part including:

a third region (203) of the first doping type and extending to the first edge;

a ninth contact (234) connected to the third region;

a portion of the first polysilicon member being in proximity with a portion of the third region to form a third transistor (101) of a second channel type, the ninth contact being a first channel terminal of the third transistor;

a fourth region (205) of the first doping type and extending to the third edge;

tenth (235) and eleventh (238) contacts connected to the fourth region, the eleventh contact being astride the third edge; and a portion of the second polysilicon member being in proximity with a portion of the fourth region to form a fourth transistor (103) of the second channel type, the tenth and eleventh contacts being first and second channel terminals of the fourth transistor, respectively;

B) a read-write port (117), in said upper part, the read-write port including:

a third polysilicon member (214) extending from the first edge to the third edge;

a portion of the third polysilicon member being in proximity with a portion of the first region to form a fifth transistor (114) of the second channel type, the third and fifth contacts being first and second channel terminals of the fifth transistor, respectively;

a portion of the third polysilicon member being in proximity with a portion of the second region to form a sixth transistor (112) of the second channel type, the sixth and eighth contacts being first and second channel terminals of the sixth transistor, respectively; and wherein the third polysilicon member may conduct a first word line signal ($CP_{13}$ WLZ) to access the memory device for reading or writing, and the fifth and eighth contacts may carry true and complement values (BIT and BITZ) of a bit read from or written to the memory device; and C) a high-speed read-only port (106) in said lower part, the high-speed read-only port including:

a fifth region (200) of the first doping type and extending to the fourth edge;

a twelfth contact (230) and at least one thirteenth contact (231, 232, 233) connected to the fifth region, the twelfth contact being astride the fourth edge;

a portion of the first polysilicon member being in proximity with a first portion of the fifth region, to form a seventh transistor (107) of the first channel type, the at least one thirteenth contact being a first channel terminal of the seventh transistor;

a fourth polysilicon member (201) extending from the first edge to the third edge;

a portion of the fourth polysilicon member being in proximity with a second portion of the fifth region to form an eighth transistor (109) of the first channel type, the twelfth contact being a first channel terminal of the eighth transistor; and wherein the fourth polysilicon member conducts a second word line signal ($V_{13}$ WL) to access the memory device for high-speed reading, and the twelfth contact may carry a value (VOUTZ) of a bit read from the memory device.

6. The memory cell of claim 5, wherein said static memory device, said read-write port, and said high speed read only port are included in a first layer of regions.

7. The memory cell of claim 6, further comprising a second layer of regions, including:

a sixth region extending from said second edge and connecting said fifth contact to a fourteenth contact;

a seventh region extending from said second edge and connecting said eighth contact to a fifteenth contact;

an eighth region extending from said first edge to said third edge and located in said upper part of said memory cell;

a ninth region extending from said first edge and connecting said fourth contact to a sixteenth contact;

a tenth region connecting said second, third, and ninth contacts;

an eleventh region connecting said first, sixth, and tenth contacts;

a twelfth region extending from said first edge and connecting said seventh contact to a seventeenth contact;

a thirteenth region extending from said third edge to said first edge and connecting said eleventh and thirteenth contacts;

a fourteenth region extending from said first edge to said third edge and located in said lower portion of said memory cell; and a fifteenth region extending from said fourth edge and connecting said twelfth contact to an eighteenth contact.

8. The memory cell of claim 7, further comprising a third layer of regions, each extending from said second edge to said fourth edge, including:

a sixteenth region connected to said sixteenth contact;

a seventeenth region connected to said fourteenth contact;

an eighteenth region connected to said eighteenth contact;

a nineteenth region connected to said fifteenth contact; and a twentieth region connected to said seventeenth contact.

* * * * *

UNITED STATES PATENT AND TRADEMARK OFFICE
CERTIFICATE OF CORRECTION

PATENT NO.    : 5,576,560
DATED         : May 26, 1998
INVENTOR(S)   : Joseph M. Antonucci and Patricia A. Bennett It is certified that error appears in the above-identified patent and that said Letters Patent is hereby corrected as shown below:

Column 1,
Line 5, please add the following:

-- This invention was supported in part by research grant number 2Y01-DE30001 to the American Dental Association Health Foundation from the National Institute of Dental Research. The Government has certain rights in this invention. --

Signed and Sealed this

Fourth Day of March, 2003

JAMES E. ROGAN
*Director of the United States Patent and Trademark Office*

UNITED STATES PATENT AND TRADEMARK OFFICE
CERTIFICATE OF CORRECTION

PATENT NO. : 5,576,560
DATED : November 19, 1996
INVENTOR(S) : Thomas J. Runaldue et al.

It is certified that error appears in the above-identified patent and that said Letters Patent is hereby corrected as shown below:

This certificate supersedes Certificate of Correction issued March 4, 2003, the number was erroneously mentioned and should be vacated since no Certificate of Correction was granted.

Signed and Sealed this

Twenty-fifth Day of November, 2003

JAMES E. ROGAN
*Director of the United States Patent and Trademark Office*